United States Patent [19]

Sato et al.

[11] 3,999,152
[45] Dec. 21, 1976

[54] CCD SELECTIVE TRANSVERSAL FILTER

[75] Inventors: Robert N. Sato, Gardena; Paul R. Prince, Manhattan Beach, both of Calif.

[73] Assignee: Hughes Aircraft Company, Culver City, Calif.

[22] Filed: Oct. 21, 1974

[21] Appl. No.: 516,832

[52] U.S. Cl. .......................... 333/70 T; 179/15 A; 307/221 D

[51] Int. Cl.$^2$ ................ G11C 19/28; H03H 7/28; H03H 7/30

[58] Field of Search ............... 333/70 T, 18, 28; 307/221 C, 221 D, 221 R; 340/173 R; 179/15 R, 15 A

[56] References Cited

UNITED STATES PATENTS

| | | | |
|---|---|---|---|
| 3,758,794 | 9/1973 | Kosonocky | 307/221 C X |
| 3,809,923 | 5/1974 | Esser | 333/70 T X |
| 3,814,955 | 6/1974 | Itoh et al. | 307/221 D X |
| 3,819,958 | 6/1974 | Gosney | 333/70 T X |
| 3,877,056 | 4/1975 | Bailey | 307/221 D X |

OTHER PUBLICATIONS

Smith et al., "Active Bandpass Filtering with Bucket Brigade Delay Lines" in IEEE Journal of Solid-State Circuits, vol. SC-7, No. 5 Oct. 1972; pp. 421-425.

*Primary Examiner*—Alfred E. Smith
*Assistant Examiner*—Marvin Nussbaum
*Attorney, Agent, or Firm*—Walter J. Adam; W. H. MacAllister

[57] ABSTRACT

A charge coupled device to provide a multi-channel selective transversal filter in which a plurality (N) of channels are sequentially processed in a common transversal filter unit to provide a desired transfer function such as a high pass filter. The analog signals from a plurality of sources or channels are fed into the selective transversal filter in serial fashion with the signal from each channel being nondestructively sampled and multiplied by appropriate weighting coefficients as provided by split electrodes separated by (N-1) charge coupled device storage bits. By having storage electrodes between the split electrodes equal to the number of input channels, the split electrodes, which provide the output signals, operate upon signal information from one channel at a time. The displacement current differences between the two halves of all of the split electrodes provide output signals having the desired filter characteristics. The transversal filter devices in accordance with the invention may be operated in a single phase clock mode or in other clock modes. The filter may have a tuning capability to modify the filter response by providing a variation of the clock frequency applied to the electrodes.

13 Claims, 15 Drawing Figures

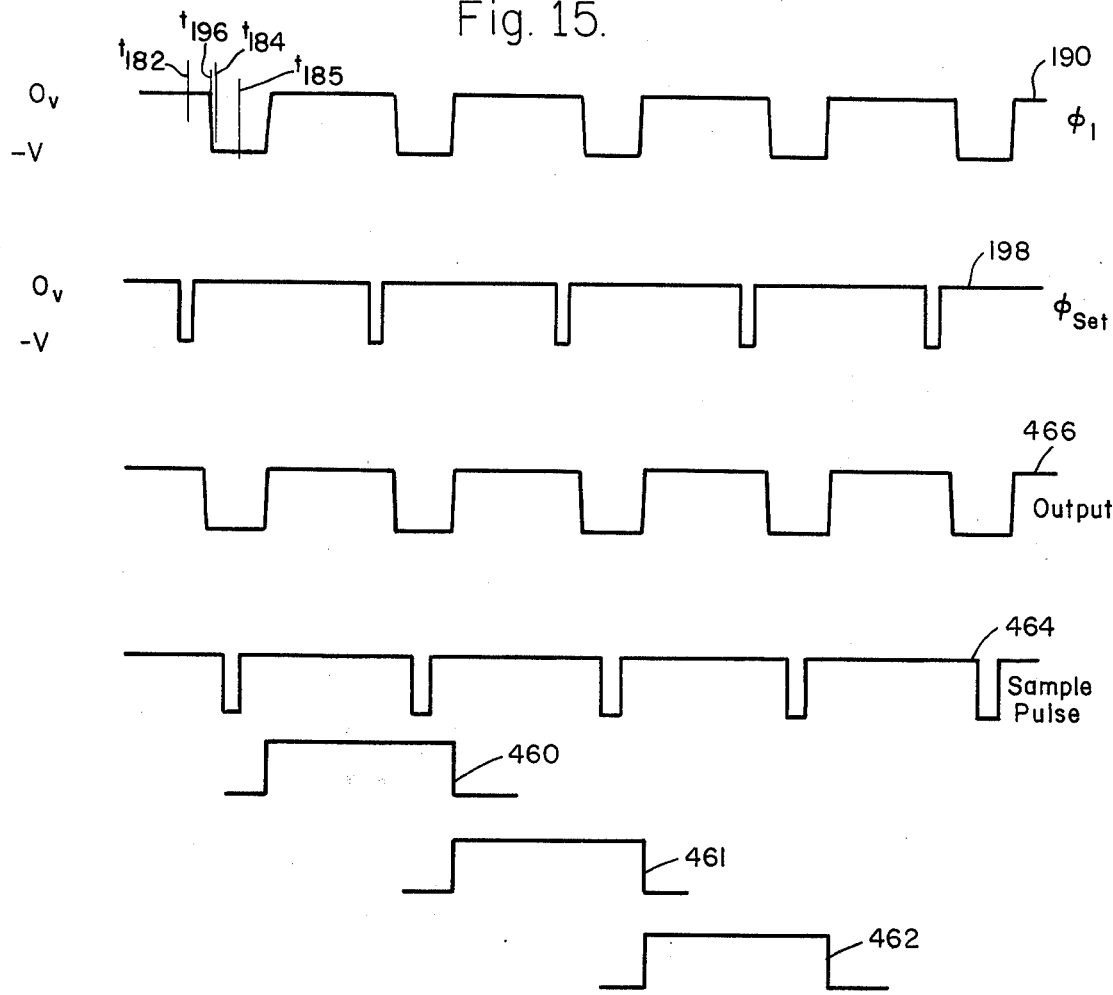
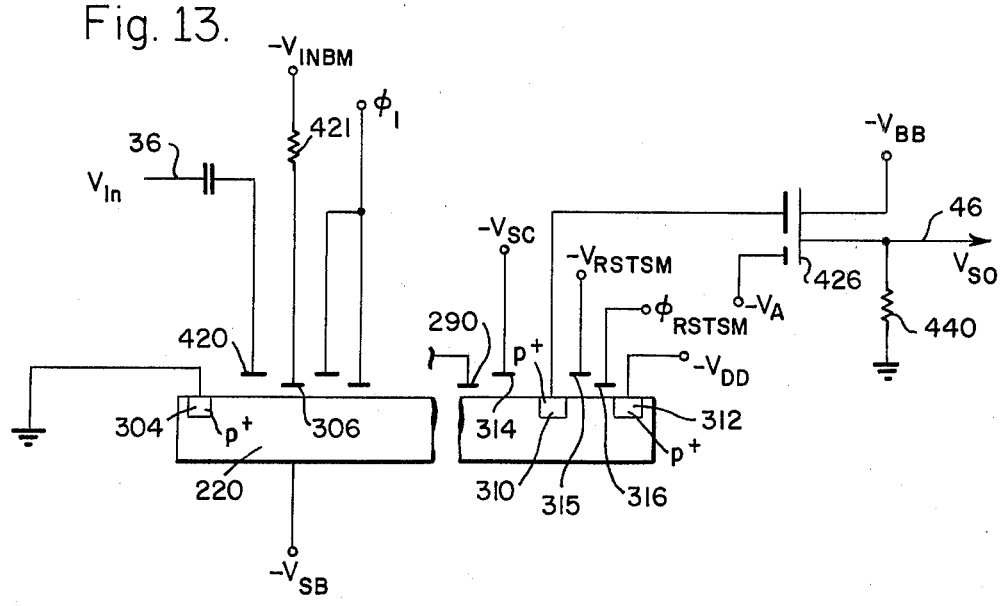

CCD SELECTIVE TRANSVERSAL FILTER

BACKGROUND OF THE INVENTION

1. Field of the Invention

This invention relates to transversal filter systems and particularly to a change coupled selective transversal filter that applies a common transfer function to the signals from the plurality of input channels.

2. Description of the Prior Art

For systems in which signals in a plurality of paralled channels, such as detector channels are to be filtered, the signals may have substantially different processing characteristics because of the variation in the gain and in the filtering parameters. A charge coupled device that would filter a plurality of signals using an integrated circuit that is common to all channels would provide indentical processing characteristics to each signal channel and would substantially decrease the complexity of the circuit. One conventional processing arrangement digitally filters the analog signal in a computer process, but this approach has the disadvantages of complexity, a substantially large volume of hardware and substantial power consumption. A selective transversal filter formed from a charge coupled device that would effectively handle a plurality of input signal channels would provide a substantial advantage to the art from the standpoint of simplicity, reliability, size and power consumption.

SUMMARY OF THE INVENTION

The transversal filter of the invention effectively operates as a charge coupled device (CCD) to provide filtering of a plurality of signals received sequentially and repeatedly from plurality (N) of channels. The anolog signal from each channel is sequentially accepted, delayed and multiplied by appropriate weighting coefficients provided by split electrodes, such that the common filtering split electrodes which are separated by N-1 CCD storage bits, operate upon signal information from one channel at a time. The difference in displacement current between opposite portions of the plurality of split electrodes provide the filtered signals for each channel. The overall configuration of the dividing point of the two halves of each of the split electrodes is selected to provide the desired frequency response. In operation which may be in a single clock phase mode, the transversal filter accepts the analog signal sequentially from each channel during consecutive clock periods and shifts the previously accepted signal to the next potential well. Because an analog shift register is effectively constructed between the transversal filter split electrodes, all of the weighting electrodes experience the charge associate with the same particular input channel during any particular clock period. All of the upper and all of the lower weighted electrodes are respectively connected together and the difference of the displacement currents between the upper and lower electrodes is sensed to provide the filtered signal. The system of the invention also allows selected changes of the frequency characteristic provided by the transversal filter by varying the clock pulse rate.

It is therefore an object of this invention to provide simplified means for filtering signals from a plurality of channels using an integrated circuit that is common to all of the input channels.

It is a further object of this invention to provide a charge coupled device operating with the split electrode displacement current principle that functions as a transversal filter for a plurality of input signals.

It is another object of this invention to provide an anolog type, charge coupled device functioning as a multiple channel selective transversal filter that operates with a minimum of complexity.

It is a still further object of this invention to provide an improved transversal filter that provides a readout signal having accurate and consistent values as a function of the input signal.

BRIEF DESCRIPTION OF THE DRAWINGS

These and other objects, features and advantages of the invention itself, will become apparent to those skilled in the art in the light of the following detailed description taken in consideration with accompanying drawings, wherein like reference numerals indicate like corresponding parts throughout the several parts wherein:

FIG. 13 is a schematic side view of the charge coupled device selective transversal filter showing an illustrated arrangement of the input and the CCD output circuits that may be utilized in accordance with the invention.

FIG. 15 is a schematic diagram of waveforms of voltage as a function of time for further explaining the driving and readout operation of the transversal filter of the invention.

DETAILED DESCRIPTION OF THE INVENTION

Figure 1:
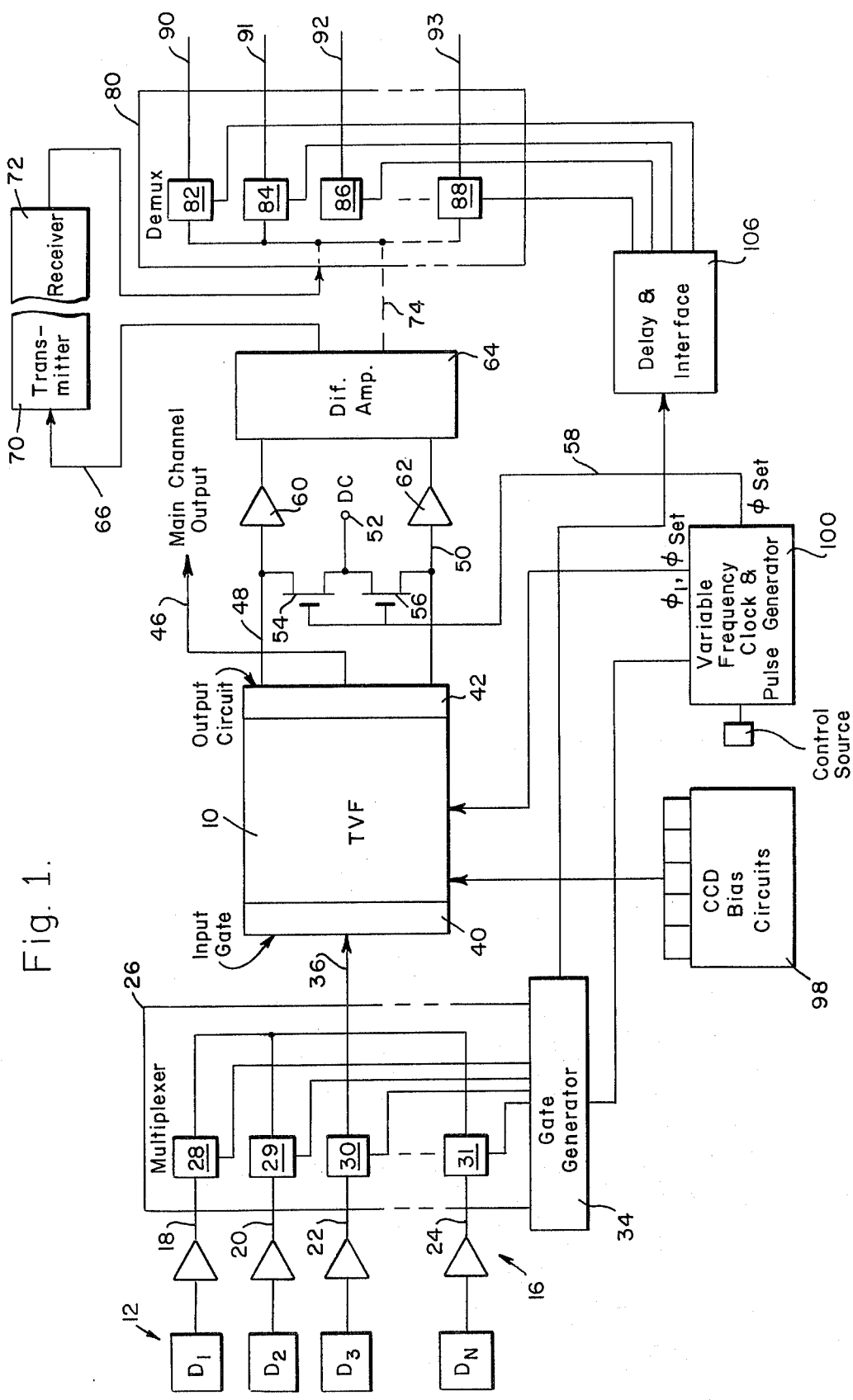
FIG. 1 is a schematic block and circuit diagram showing the transversal filter in accordance with the invention operating with a plurality of input channels.

Referring first to FIG. 1, a multiple channel charge coupled device (CCD) transversal filter 10 is provided to the common CCD input a common or integrated unit to prevent unwanted response variations of the N signals coming from a source 12. A plurality of signal (e.g. infrared) detectors D1, D2, D3 to $D_N$ is included in the source 12 for applying detected signals through suitable amplifiers 16 to respective individual channel leads 18, 20, 22 and 24. It is to be noted that the system of the invention may be constructed to operate with any number of channels but in the illustrated arrangement includes 10 channels with $D_N$ being the detector for the Nth channel. The amplified signals are then applied through a multiplexer 26 which may be any suitable conventional arrangement but which may include N gates such as 28, 29, 30, 31, each responding sequentially to gate pulses provided by a gate generator 34 which is syncronized with the CCD clock. Any repetitive pulse forming circuit such as a recirculating counter may provide 10 repetitive and continuous pulses for sampling each of the detectors D1 to $D_N$ and applying a sampled signal to the common CCD input lead 36. The signal representing the channels in a series format is then applied through the lead 36 to an input gate 40 of the transversal filter 10, through the transversal filter, and to output circuit 42 which may provide an unfiltered signal to a main channel output lead 46 for test purposes, as an example. The filtered signal is applied through output leads 48 and 50 which, as will be further explained, represent the summed difference in displacement currents between the split electrodes which in turn represents the filtered signal in a series format. With the illustrated single phase CCD operation that may be utilized in accordance with the invention, a DC source 52 may be clamped through suitable FET transistors 54 and 56 to respective leads 48 and 50, in response to a timing pulse on a lead 58 to establish a common readout potential of charge level in the charge coupled device. The signals on the leads 48 and 50 are then applied through suitable amplifiers 60 and 62 to a differential amplifier 64 to provide a difference signal on an output lead 66 representing sequentially for each channel, the filtered signal as provided by the transfer characteristic of the transversal filter 10. The signal on the lead 66 may either be coupled through a suitable link that may include a transmitter and receiver 70 and 72 or directly through a lead or coupling structure indicated by dotted line 74, to a suitable demultiplexing unit 80, which may be of any suitable type. The demultiplexing unit 80 may include N sample and hold gates such as gates 82, 84, 86, and 88 to respectively apply the demultiplexed signal to N output leads such as 90, 91, 92 and 93. A charge coupled device bias circuit 98 may be provided to apply the suitable potentials to the transversal filter 10 and a variable clock and pulse generator 100 may provide the phase and the $\phi_{SET}$ pulses to the transversal filter as well as to the gates 54 and 56. The output of the gate generator 34 may be applied to suitable delay and interface unit 106 to provide the gating pulses to the sample and hold circuits such as 82, 84, 86 and 88. In order to sample the signal at the proper time during each clock interval the fixed delay may be provided followed by an interface circuit as one illustrative example to provide a pulse of the right width and amplitude as required by the sampling time of the signal and the multiplexer requirements.

Figure 2:
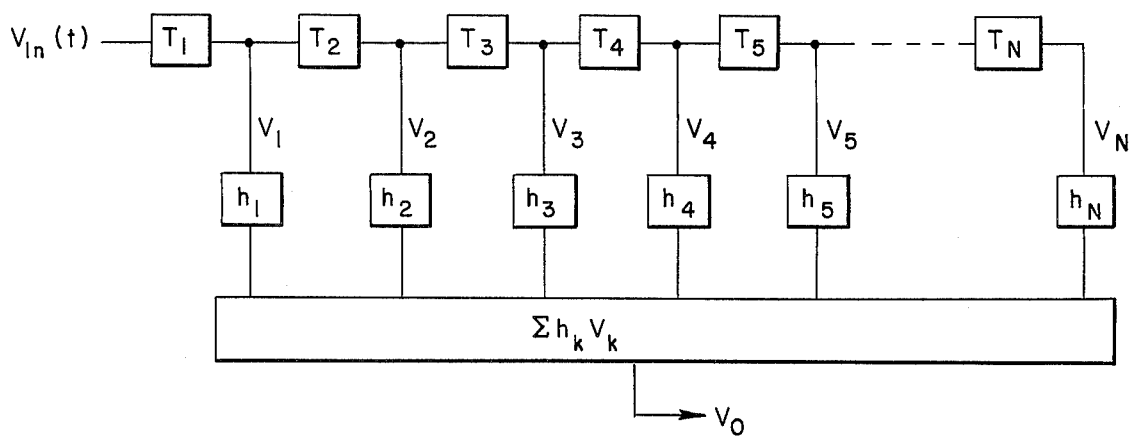
FIG. 2 is a schematic block diagram of a typical transversal filter for explaining the operation of the invention.

Referring now to FIG. 2 which is a block diagram of a conventional transversal filter, the input $V_{IN}(t)$ which is the signal to be filtered is sampled at least at a rate greater than twice the highest frequency of interest in the signal. This sampling stage is then followed by N delay stages T shown as T1 to T5 and $T_N$, each of which delays a signal sample for one clock period. At each delay stage, a signal in nondestructively sampled, multiplied by a predetermined weighting coefficient $h_k$ and the weighted samples are summed to give the filter output $V_O$ by splitting alternate buried metal CCD electrodes and sensing the displacement current sums in the upper and lower portions. The weighting coefficients $_k$ are determined by the desired impulse response of the filter which is the time domain representation of the frequency response of the filter. A charged coupled device thus can process an analog signal directly by utilizing sample data delay line characteristics and providing a convolution of the input signal with the impulse response of the filter. The output signal may be described as $$V_o(t) = \int_0^\infty h(\tau)V_{IN}(t-\tau)d\tau$$

where
Y is the delay time.
$V_o(t)$ is the output signal.
$h(Y)$ is the filter characteristic.
$V_{IN}(t\text{-}Y)$ is the delayed incoming signal to be filtered
The output signal may also be expressed as $$V_o(n\tau_c) = \sum_{k=1}^{N} h_k V_{in}[(n-k)\tau_c]$$

where $Y_c=$ delay of one clock period and N = number of weighting coefficient stages. It is to be noted that the first equation is a continuous function and the latter equation is a discrete function. This expression of a discrete function corresponds to the operation of a CCD transversal filter in accordance with the invention. The output signal may be also expressed as
$V_o = h_1V_{IN}(n-1)Y_c+h_2V_{IN}(n-2)Y_c+h_3V_{IN}(n-3)Y_c+ \ldots +h_NV_{IN}(n-N)Y_c$ where $V_{IN}(n\ Y_c)$ shows that the input is sampled a discrete number of times N equal to the number of stages, and $Y_c$ is equal to the delay of one clock period.

Figure 3:
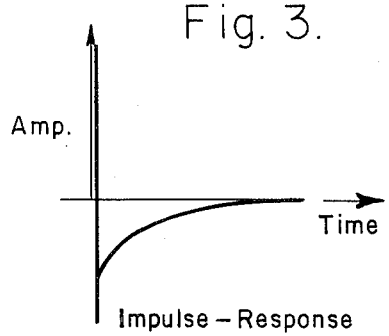
FIG. 3 is a schematic impulse response diagram showing amplitude as a function of time for a RC high pass filter circuit.
Figure 4:
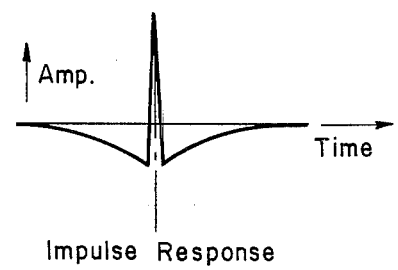
FIG. 4 is a schematic impulse response diagram showing amplitude as a function of time for a high pass filter which is made symmetrical about the amplitude axis and has a linear phase response characteristic.
Figure 5:
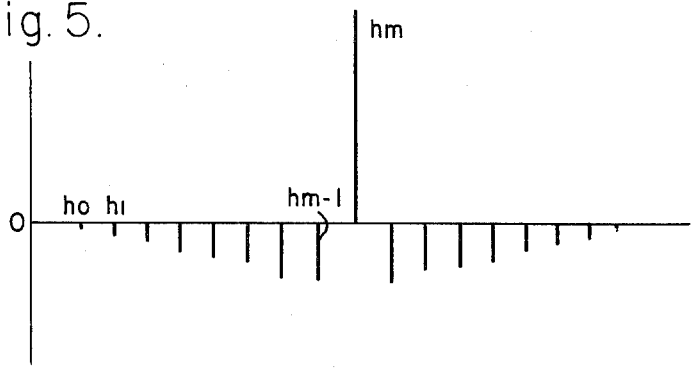
FIG. 5 is a CCD high pass filter layout diagram showing the weighting coefficients provided by the charge coupled device transversal filter in accordance with the invention.
Figure 6:
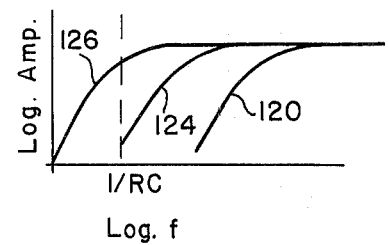
FIG. 6 is a schematic diagram of log amplitude as a function of log freguency showing the frequency response for a high pass filter as provided by the invention to illustrate the selective frequency response characteristic thereof.

Referring now to FIGS. 3, 4, 5 and 6 which illustrate some of the frequency characteristics that may be developed by the filter in accordance with the invention. In order to model a transversal filter as an approximation to an RC network, the filter will have a characteristic or an impulse response as shown in FIG. 3 and a frequency response as shown in FIG. 6. To provide linear phase as a function of frequency, the impulse response for the filter is made symmetric about the positive peak as shown in FIG. 4. The weighting coefficients $h_k$ for a linear phase high pass impulse response in shown in FIG. 5 where the exponential has been approximated linearly, The filter frequency response shown in FIG. 6 may be varied by changing the clock pulse repetition frequency so that at a high pulse repetition frequency, the response has a configuration as shown by the curve 120 at an intermediate pulse repetition frequency a response as shown by a curve 124 and at a low pulse repetition frequency a response as shown by a curve 126. The system of this invention may provide variation of the clock pulse repetition frequency to develop these changes in frequency characteristics.

Figure 7:
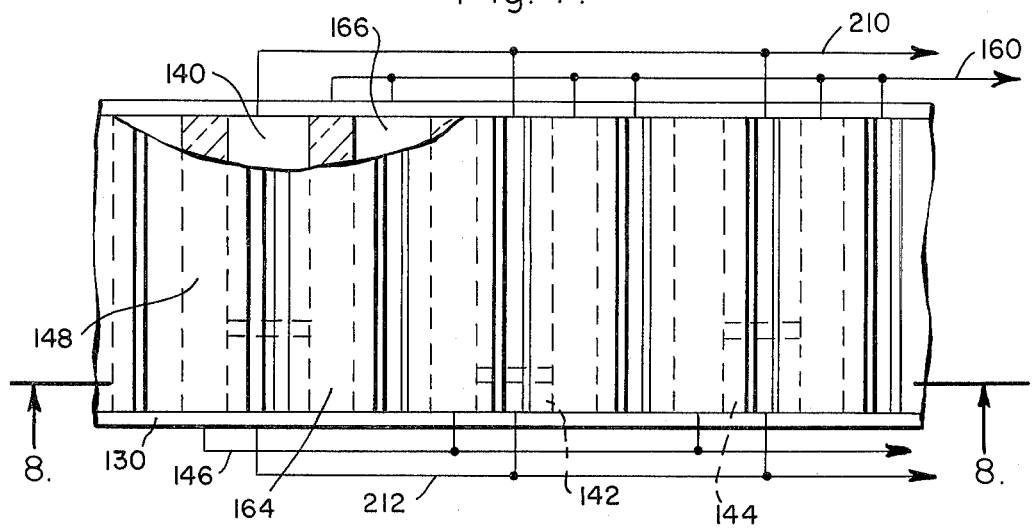
FIG. 7 is a schematic top view of a charge coupled device transversal filter chip of a conventional electrode configuration for explaining the single phase operation thereof to assist in understanding of the P channel transversal filter in accordance with the invention.
Figure 8:
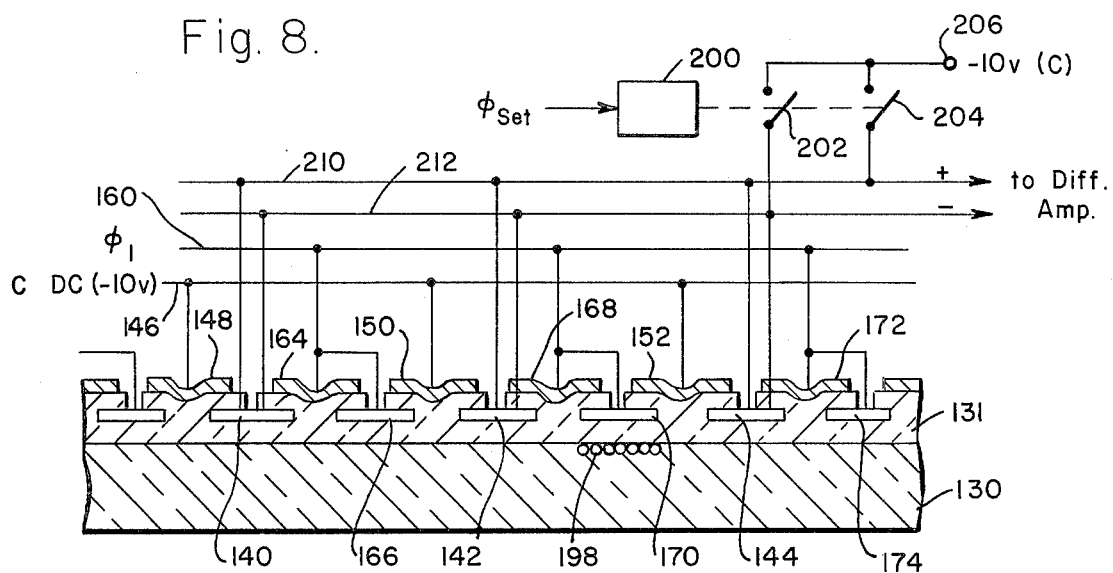
FIG. 8 is a schematic section drawing taken at lines 8—8 of FIG. 7 for further explaining the transversal filter operation.

Referring now to FIGS. 7 and 8 which show a conventional charged coupled device transversal filter, the single phase operation thereof will be generally explained for a better understanding of the operation of the multiple channel transversal filter and of the improved readout operation in accordance with the invention. The charge coupled device includes an n type silicon substrate 130, a silicon dioxide (SiO$_2$) layer 131 thereon with buried electrodes therein which for example may be polysilicon electrodes, and with aluminum electrodes deposited on a surface thereof evenly spaced between and overlapping the buried electrodes. The arrangement includes every fourth buried electrode being a split electrode such as shown by electrodes 140, 142, and 144 with a DC line or lead 146 coupled to the adjacent surface electrodes such as 148, 150 and 152. The phase one ($\phi_1$) clock pulse on a lead 160 is applied to the other two electrodes (one buried and one surface) between each split electrode such as electrodes 164 and 166, electrodes 168 and 170, and electrodes 172 and 174.

Figure 9:
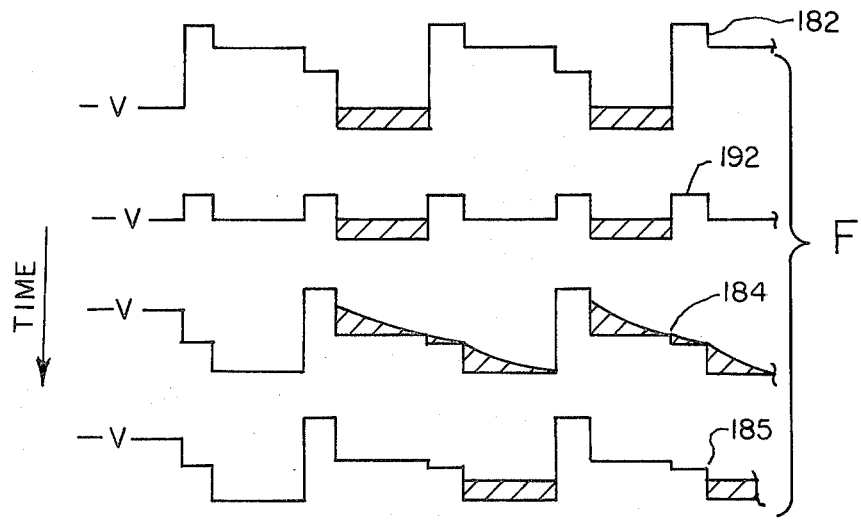
FIG. 9 is a schematic diagram of charge distribution as a function of time for further explaining the operation of the transversal filter of FIGS. 7 and 8.

Each group of four adjacent electrodes such as 164, 166, 150 and 142 form a single delay element (bit) so that at a time when $\phi_1$ is fully ON, or about $-20$ volts the charge has flown to the condition of waveform 182 of FIG. 9. This condition is present during the occurence of negative pulses as shown by waveform 190 of FIG. 15. In the absense of a negative pulse, the condition of the waveform 185 occurs. Signal charges are trapped holes as shown by the holes 198 in FIG. 8. Upon the rise of the $\phi_1$ pulse toward zero volts of the waveform 190 the charge flows through a transistion midpoint condition as shown by waveform 196 followed by waveform 184. Charge is thus constrained to move only from left to right during each $\phi_1$ clock transistion by virtue of the overlapping electrode and the resulting electrostatic potential profiles beneath the electrodes. Whenever this charge transfers under an electrode a displacement current flows in the electrode lead. At the next $\phi_1$ clock, the charge of the waveform 185 moves forward to the potential well to the right of the charge on the waveform 182.

As shown by a waveform 198 of FIG. 15, a control or pulse source 200 responds to the $\phi_{SET}$ signal to close gates 202 and 204 and establish a reference voltage from the minus ten volts DC source 206 using the split electrode lines 210 and 212. This reference charge establishes a predetermined voltage on all electrodes so that a reliable and constant readout value can be obtained. At some appropriate time between adjacent $\phi_{SET}$ pulses of the waveform 198, the output difference current is monitored to provide the representation of the sample signal during that clock period. The output voltage of a waveform 466 shows the periods of each multiplexed detector data which may coincide with the readout $\phi_{SET}$ pulse period during which readout is not performed. Thus, the operation continues in response to an input signal with the split electrodes having a configuration to provide a desired frequency characteristic as indicated by the split configuration on the plan view of FIG. 7. The $-V$ voltage shown at the waveforms of FIG. 9 is a relative potential to show the relations between points 182, 196, 184 and 185 and is actually the depletion potential at the surface of the semiconductor (including any signal charge), not the voltage on the electrode. It is to be noted that a characteristic of a transversal filter is that a plurality of frequency relations may be provided and in accordance with the split electrode concept requires only that the configuration of the split electrodes along the length of the charge coupled device be selected to provide the desired frequency response characteristic. The time of occurrence of the waveforms 182, 196, 184 and 185 may be further clarified by the times of occurrence at any pulse of a waveform 190 of FIG. 15 indicated at one pulse as times $t_{182}$, $t_{196}$, $t_{184}$, and $t_{185}$.

Figure 10:
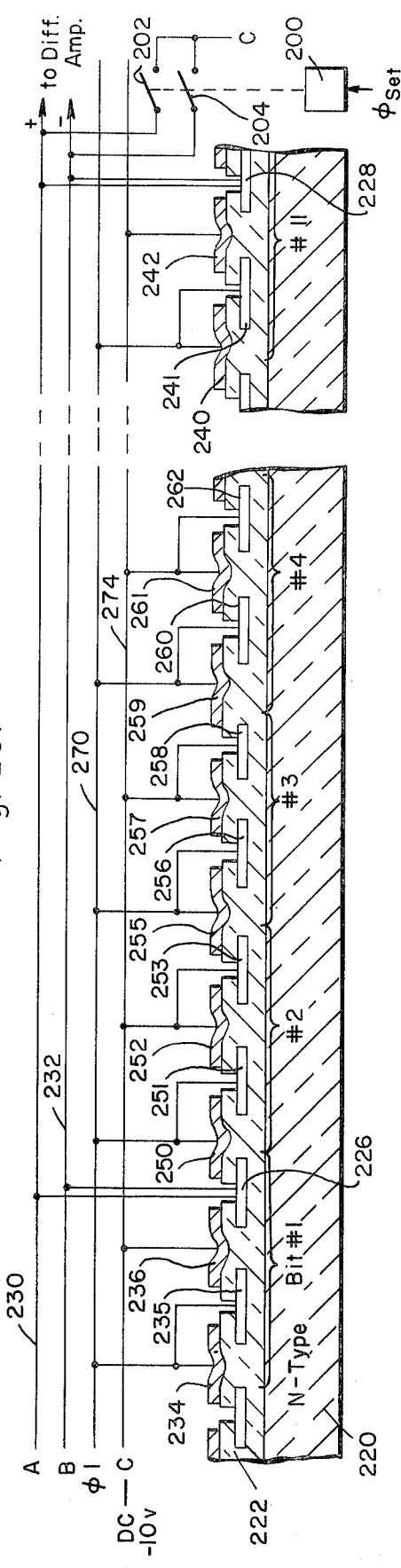
FIG. 10 is a schematic side view of a portion of the multiple P channel transversal filter in accordance with the invention.

Referring now to FIG. 10 which is a cross-sectional view of the multiple channel charge coupled device transversal filter in accordance with the invention, the filter is formed on an n type doped silicon substrate 220 having a silicon dioxide insulating layer 222 all similar to the transversal filter arrangement of FIG. 8. Electrodes of a suitable conductive material such as aluminum are deposited on the surface and buried electrodes of any suitable conductive material such as polysilicon are positioned and contained in the silicon dioxide layer 222. The transversal filter includes buried split electrodes 226 and 228 having alternate ends thereof coupled to different leads 230 and 232. Each buried split electrode such as 226 has associated therewith three other electrodes such as 234, 235 and 236, the four electrodes forming bit or bit position No. 1. As further illustration, buried split electrode 228 has electrodes 240, 241 and 242 associated therewith, the four electrodes forming bit No. 11. In order that the charge coupled device analog shift register serves as a storage element in the filter, only every 10th sampled signal along the electrodes corresponds with signals from a particular channel of the 10 illustrated detector channels. The filter is thus capable of storing the incoming signals temporarily and 9 delay elements (bits or bit positions) are provided between each split weighting electrode such as 226 and 228. Electrodes 250, 251, 252 and 253 act as a delay element, (bit No. 2) electrodes 255, 256, 257 and 258 act as another delay element (bit No. 3) and electrodes 259, 260, 261 and 262 act as a further delay element (bit No. 4). Phase one or $\phi_1$ clock pulses on a lead 270 are applied to electrodes 234 and 235, electrodes 250 and 251, electrodes 255 and 256, electrodes 259 and 260 and electrodes 240 and 241. The DC value for single phase operation which value may be $-10$ volts in order to deplete the substrate under the gate, is applied on a lead 274 to electrodes 236, 252, and 253 to electrodes 257 and 258 to electrodes 261 and 262 and to electrode 242. It is to be noted that $\phi_{SET}$ voltage applied to each end 230 and 232 at the proper timing relative to the clock pulse establishes a reference potential in the buried split electrodes so that an accurate readout value is provided at sample time.

Figure 11:
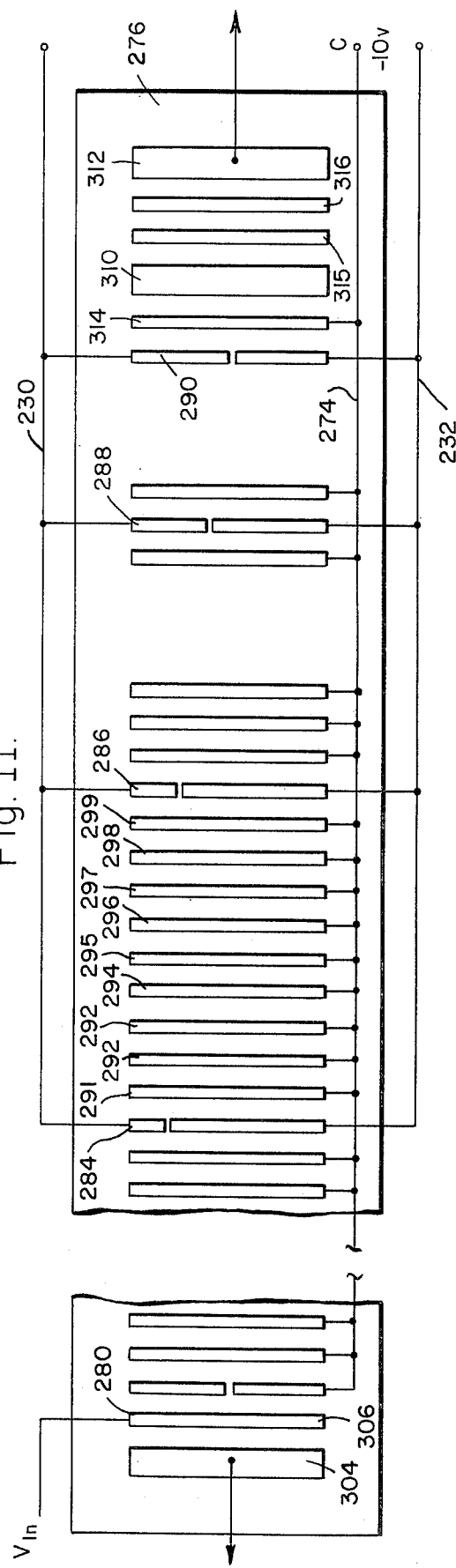
FIG. 11 is a schematic top view of the multiple bit shift register, CCD transversal filter in accordance with the invention showing only one electrode for each four to further illustrate the arrangement of the shift register elements and the split electrode elements.

Referring now also to FIG. 11 as well as to FIG. 10 a schematic plan view of the 10 bit shift register CCD transversal filter in accordance with the invention is shown with each split electrode such as 280, 284, 286, 288 and 290 representing only the buried split electrodes with the three additional electrodes such as the electrodes 234, 235, 236 and 226 of FIG. 10 not being shown. Each unsplit or continuous electrode such as electrodes 291 to 299 represents the electrodes such as 253 and 258 corresponding to repetitive position to the split electrode position relative to the other three electrodes of each storage group such as electrodes 250, 251, 252 and 253 and electrodes 255, 256, 257, and 258 of FIG. 10. In the illustrated system there are 17 of the split electrodes (each with 3 associated continuous electrodes not shown). Between each split electrode there are 9 operational shift register electrodes each with 3 associated continuous electrodes, the shift register electrodes and the following split electrode providing storage 10 channels. The DC bias potential of the lead 274 (lead C) is applied to each of the illustrated surface and unweighted buried electrodes. The leads 230 and 232 which correspond to the respective leads 48 and 50 of FIG. 1 then pass through suitable amplifiers to the differential amplifier 64 for providing a differential signal proportional to the sum of all of the split electrode displacement currents, continually representative of the filter characteristic operating upon the selected detector channel sequentially.

The input to the CCD is provided by a diffusion region of p+ type silicon material 304 as well as a single electrode 306 receiving the input signal $V_{IN}$. The CCD output may be provided by two p+ type diffusion regions 310 and 312 and appropriate bias electrodes 314, 315 and 316 as will be further explained relative to FIG. 13.

Figure 12:
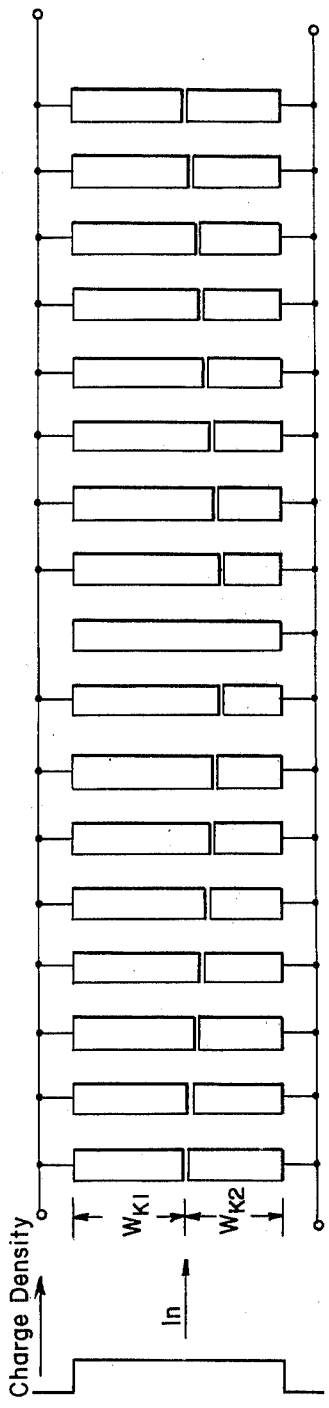
FIG. 12 is a schematic diagram showing only the split electrode elements of the transversal filter of FIG. 11 for further explaining the arrangement of the pattern of the gaps to provide a desired filter characteristic.

Referring now to FIG. 12, the configuration of the split electrodes is shown schematically to indicate an impulse response characteristic similar to the weighting coefficients referred to in FIG. 5 representing a high pass linear phase transversal filter. It should be noted that in the arrangement of FIG. 12 the shifting electrodes associated with each split electrode as well as the storage electrodes between the split electrodes, have been omitted for clarity. As can be seen by the gap or split position, the segment lengths $W_{k1}$ and $W_{k2}$ defines the weighting coefficient $h_k$ where $h_k = W_{K1} - W_{K2}$. The differences in the lengths, summed over all 17 split electrodes, thus provides the filter characteristic when the charge is non destructively sampled by the weighting electrodes. The principles of the invention are not limited to a high pass filter characteristic as shown by the configuration of the split electrodes of FIG. 12, any characteristic selectively provided by the weighted or split electrode configuration may be developed by the system in accordance with the invention.

Referring now to FIG. 13, an input and output structure that may be utilized in the system of the invention will be further explained. It is to be understood that this is just one illustrated arrangement and that any suitable input and output configuration may be utilized in the transversal filter in accordance with the invention. The signal $V_{IN}$ is applied on the lead 36 to the electrode 420. Bias voltage, $V_{INBM}$ is applied on the lead 421 to the electrode 306. The input diffusion region 304 is biased to ground in the illustrated arrangement, and the N type substrate 220 is biased to a positive voltage $V_{SB}$ to establish a reverse bias to the diffusion.

In operation, the diffusion region 304 is capable of supplying charge to the CCD according to the channel condition under the electrode 420. The charge is then stored in the potential well under the gate 306. The charge in this potential well is unidirectionally transported to the adjacent potential well during each clock period. Thus upon application of a signal voltage to the lead 36, current is drawn from the p+ diffusion region 304 and passes along to a subsequent electrode in response to each clock pulse.

The negative bias voltage $V_{SC}$ applied to the electrode 314 which is a screen electrode sets up the potential barrier between the last clock well and the reset well between the diffusion regions 310 and 312. The reset surface electrode 315 is biased by a negative voltage $V_{RSTSM}$ which is less negative than the output diffusion region voltage $V_{DD}$. One electrode of a MOSFET (field effect transistor) 426 is biased to voltage $V_{BB}$ and the other electrode is coupled to the output lead 46 and through a source resistor 440 to ground. A tetrode electrode is coupled to a potential source $V_A$ to minimize the MOSFET capacitance and the control electrode is coupled to the diffusion region 310 to monitor the charge. When the reset pulse is applied to the $\phi_{RSTSM}$, the barrier electrode 310, all of the charge stored in both reset potential wells is swept away to the output diffusion area 312 and the floating diffusion potential becomes the same as that of the output difffusion voltage. The transistor 426 provides a floating diffusion source follower to monitor the charge stored in the surface reset potential well between the diffusion regions 310 and 312. A signal $V_{SO}$ on the lead 46 represents the unfiltered input signal delayed by the total number of bits times the clock period and in some instances may be utilized for test purposes.

The following voltages are given as an illustrative example of values that may be utilized in the input and the output circuits of FIG. 13.

| LABEL | DESCRIPTION | VALUE |
| --- | --- | --- |
| $V_{SB}$ | Substrate | 5.0 Volts |
| $V_{DD}$ | Reset Drain | −10 Volts |
| $V_{SC}$ | Screen | $V_{DD}$ Volts |
| $V_{BB}$ | Output Drain | −15 Volts |
| $V_{SS}$ | Diffusion | 0 Volts |
| $V_A$ | Output Tetrode Gate | $-V_{BB}$ Volts |
| $V_{RSTBM}$ | Aluminum Reset Gate | $-V_{BB}$ Volts |

Figure 14:
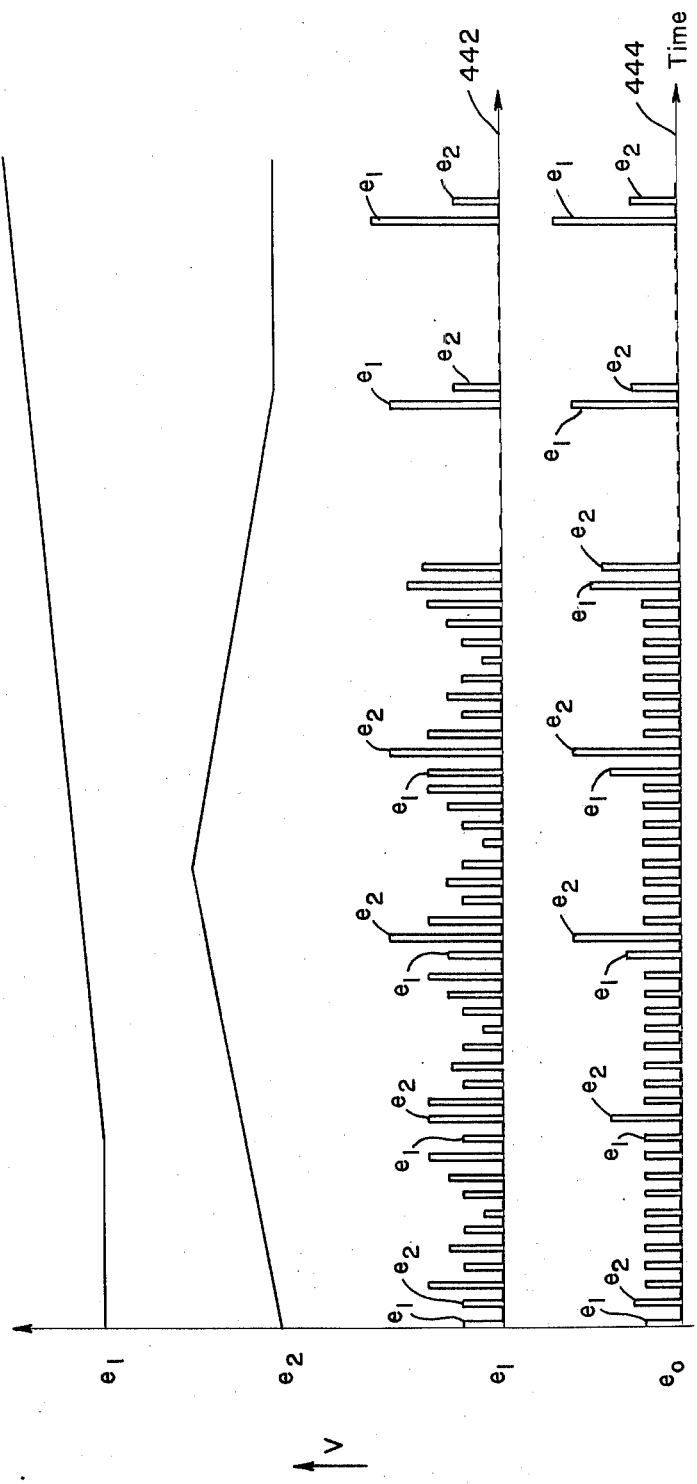
FIG. 14 is a schematic diagram of waveforms of voltage amplitude as a function of time for further explaining the multiple channel operation of the transversal filter in accordance with the invention.

Referring now to the waveforms of FIG. 14 as well as to FIGS. 1, 10 and 11, the input signals $e_1$ and $e_2$ represent the outputs of respective detectors D1 and D2 and the sample data $e_0$ of the waveform 442 represents the repetitive pattern of the sampled detectors as applied to the input lead 36 of the multiple channel transversal filter. The signal $e_0$ of a waveform 444 represents the output signal as provided by the output difference of the differential amplifier 64 with each of the signals such as $e_1$ and $e_2$ being repetitive during each pattern. The signal of the waveform 444 occurs prior to demultiplexing to 10 separate lines. Referring now to FIG. 15, the clock pulse of the waveform 190 which is the signal $\phi_1$ is provided by the variable frequency clock generator 100 and it may be changed in pulse repetition frequency to provide selective filter characteristics. The $\phi_{SET}$ pulse of the waveform 198 establishes the reference charges on both halves of the split electrodes and on all of the split electrodes so that the readout values are referenced to a constant level. The $\phi_{SET}$ pulses energize the gates 54 and 56 at times which may coincide substantially within the clock pulses of the waveforms 460, 461, 462, sampling the detectors sequentially to serially apply the signals to the transversal filter. Demultiplexing which requires a sampling interval to provide a signal that can be stored, is controlled by the pulses of the waveform 464 and is repetitive every 11th clock period for the same demultiplexing gate of the demultiplexer 80 and may be driven from the same clock source as shown in FIG. 1. The output signal prior to demultiplexing as shown by a waveform 466 has an interval during the upper $\phi_1$ signal that would not be desirable in the output, so that the sample pulse of the waveform 464 may occur at any suitable time while $\phi_1$ is negative. Thus the P channel CCD selective transversal filter of the invention operates to reliably provide any desired filter characteristic for a plurality of channels with the output being either in a series format or being converted back into a parallel format as required by further processors (not shown). The illustrated transversal filter having split electrodes effectively provides a 17 bit filtering operation.

Referring now principally to FIG. 10, the fabrication may be performed utilizing known silicon processing technology. The following sequence is given only as an illustration of the processing steps and it is to be understood that other techniques and steps may be utilized within the scope of the invention.

1. An n-type silicon substrate block is selected with a 2–3 ohm centimeter resistivity.
2. Oxide is grown on one side of the silicon substrate to a thickness of 1 micrometer.
3. A mask and a photo-resist process is utilized to form holes through which n+ dopant is diffused for channel stops if desired at two ends of block.
4. Windows are opened by photo-resist process into which p dopant is injected to form the regions 304, 310 and 312.
5. The oxide mask is used to strip all oxide out of regions where 1000 angstroms of $SiO_2$ is to be grown.
6. The thin oxide 222 is grown on the surface of the silicon and the buried channel area is ion implanted.
7. Polysilicon is deposited 5000 angstrom thick over entire surface of the thin oxide.
8. The polysilicon is etched with a mask to form the buried polysilicon electrodes.
9. The polysilicon is oxidized to 1500 angstroms to form a passivation layer. The regions between the polysilicon to be covered by aluminum electrodes have a thicker oxide growth of 2000 angstroms.
10. Contact holes are formed by masking and etching through the polysilicon over regions to be contacted by an aluminum layer such as openings to the input and output p+ regions, openings to the n+ stop region if utilized on contacts to each polysilicon strip for forming the conductors or leads if they are to be the deposited type.
11. Aluminum is deposited over entire surface to 10,000 angstrom thickness, for example.
12. The aluminum is etched with a suitable mask to form the aluminum electrodes, the connections to the electrode and regions, connections to buried polysilicon electrodes as well as any leads that are to be formed. It is to be noted that the channel such as 310 (FIG. 11) along the length of the aluminum electrode results from the aluminum deposition in step 10 between the etched polysilicon strips. These masking and etching techniques are well known in the art and do not need to be explained in further detail.

Thus there has been provided a sample data filter of the charge coupled device type providing a transversal filter function for a plurality of input channels that accepts the analog signal from the first channel during one clock cycle and stores the charge in the potential well under the first bit electrode. During the next clock period the selective transversal filter accepts another analog signal from the second channel exactly the same as for the first channel and the signal charge of the first channel which was previously stored under the first bit is then shifted to the next potential well under the second bit electrode. The selective transversal filter therefore accepts the analog signals sequentially from each channel during consecutive clock periods and shifts the previously accepted signal to the next potential well. This analog shift register is positioned between the transversal filter split electrodes so that all of the weighted electrodes experience the charge associated with the same particular channel during any clock period. Each of the electrodes, that is the weighted electrodes, delay the signal from the $k$th weighted electrode by a number of clock periods equal to $k \times N$. The upper and lower portions of the weighted electrodes are connected such that a difference of the displacement currents between these upper and lower portions is sensed, representing the signal having a specific weighting coefficient for each weighted electrode for the selected filter characteristic such as a high pass filter characteristic. By establishing a common reference voltage at both ends (each weighted electrode node) prior to sampling, accurate readout signals are provided which properly sum the weighted signals. It is to be understood that the filter characteristic may be variable, being a function of the clock pulse repetition frequency. Thus the selective filter of the invention provides filtering of a plurality of input signals using an integrated circuit common to all channels so as to decrease the complexity of the system and provide identical processing or filter characteristics to each signal channel. The selective filter of the invention may be utilized for any suitable type of system operation, such as when discrete component filtering is impractical and common filtering would provide substantial advantages.

What is claimed is:
1. A charge coupled transversal filter responsive in a common channel to a plurality of sequential and repetitive input signals each from a separate source comprising:
   a substrate;
   a plurality of weighting means each including a group of electrodes, said group providing a bit delay, the number of weighting means representative of the number of bits of the transversal filter and positioned along said substrate;
   a plurality of storage electrode means each including a group of electrodes providing a bit delay and positioned along said substrate between adjacent weighting means, the number of said storage electrode means being equal to one less than the number of signal sources;
   means coupled to said substrate for providing an analog shift input means for receiving said input signal and applying it to a first end of said substrate;

output means coupled to said plurality of weighting means; and clocking means coupled to said weighting means and to said storage electrode means for sequentially transferring said signal to said output means.

2. The combination of claim 1 in which said output means includes first and second leads respectively coupled to opposite ends of said plurality of weighting means and differential means coupled to said first and second leads and responsive to signals thereon for providing a difference signal during each clock interval representative of one of said input signals filtered with a selected characteristic.

3. The combination of claim 2 in which each of the weighting means includes a split electrode having first and second portions, the split electrodes of said plurality of split electrode means having lengths relative to each other to provide said selected filter characteristic.

4. The combination of claim 3 responsive to a plurality of signal sources and further including multiplexing means coupled between said plurality of signal sources and said input means for developing said sequential input signal; and demultiplexing means coupled to said differential means for converting the serial filtered signal to a plurality of parallel signals.

5. The combination of claim 1 in which said clocking means includes controllable means to vary the repetition frequency of the clock pulses and vary the filter transfer characteristic.

6. The combination of claim 4 in which the clocking means is coupled to said plurality of split electrodes means and said plurality of storage electrode means to provide a single phase transfer of the signal, means is provided to apply phase reset current to said split electrode means.

7. The combination of claim 4 in which a source of reference potential is provided and switching means is provided coupled between said source of reference potential and said first and second leads for establishing reference voltages on said split electrodes prior to readout of the difference signal.

8. The combination of claim 7 in which said demultiplexing means is controlled to sample said output signal between times when said reference potential is applied to said split electrode means.

9. A charge coupled selective transversal filter having a plurality of split electrodes and a plurality of continuous electrodes positioned along the surface of a substrate and responsive to a plurality of sequential input signals comprising:

single phase clocking means coupled to selected ones of said electrodes for transferring charges along said substrate;

first and second leads respectively coupled to opposite ends of said split electrodes;

differential means coupled to said first and second leads;

readout means coupled to said differential means for periodically providing a readout signal each representing one of said pluralities of input signals; and a source of switched DC current coupled to said first and second leads for providing a reference bias thereto prior to development of each readout signal.

10. A charge coupled device for transferring a signal along a substrate comprising:

a plurality of electrodes positioned along said substrate with selected ones being continuous electrodes and split electrodes;

differential current means coupled to opposite ends of said split electrodes for providing a difference current;

a single phase source coupled to selected ones of said electrodes;

a DC source coupled to selected ones of said electrodes;

a phase set DC source; and switching means coupled between said phase set DC source and both ends of said split electrodes for periodically establishing a common reference voltage thereon.

11. The combination of claim 10 in which the charge is transferred in groups of four electrodes and in which two of these electrodes in each group are coupled to said single phase source, one electrode is coupled to said DC source and one electrode is coupled to said DC source of a continuous electrode and coupled to said switching means of a split electrode.

12. An N channel transversal filter charge coupled device comprising:

a source of repetitive groups of N sequential input signals;

a substrate;

a selected number of groups of (N-1) electrode means positioned along said substrate;

split electrode means of said selected number with one positioned adjacent to each of said groups;

first and second combining means respectively coupled to opposite ends of said split electrodes; and differential means coupled to said first and second combining means to provide a difference signal.

13. The combination of claim 12 in which said split electrodes have first and second portions of relative lengths selected along said substrate to provide a desired filter characteristic to said output signals.

* * * * *